(12) United States Patent
Yamamoto

(10) Patent No.: US 6,246,288 B1
(45) Date of Patent: *Jun. 12, 2001

(54) OPERATIONAL AMPLIFIER

(75) Inventor: Shouhei Yamamoto, Miyazaki (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,023

(22) Filed: Sep. 3, 1999

(30) Foreign Application Priority Data

Sep. 9, 1998 (JP) .................................................. 10-255084

(51) Int. Cl.[7] ....................................................... H03F 3/45
(52) U.S. Cl. ........................................... 330/253; 330/255
(58) Field of Search ..................................... 330/253, 255, 330/261

(56) References Cited

U.S. PATENT DOCUMENTS

| | | | |
|---|---|---|---|
| 4,335,355 | * 6/1982 | Haque | 330/253 |
| 4,524,329 | * 6/1985 | Abou | 330/253 |
| 4,622,480 | * 11/1986 | Uchimura et al. | 307/491 |
| 4,893,092 | * 1/1990 | Okamoto | 330/253 |
| 5,285,168 | * 2/1994 | Tomatsu et al. | 330/253 |

* cited by examiner

Primary Examiner—Robert Pascal
Assistant Examiner—Henry Choe
(74) Attorney, Agent, or Firm—Jones Volentine, L.L.C.

(57) ABSTRACT

In order to reduce power consumption and prevent crossover distortion, the difference between a negative phase input voltage and a positive phase input voltage is amplified at a differential stage and a differential output voltage is output. The state of continuity of an NMOS transistor is controlled with the differential output voltage. By controlling the product of the current flowing through a resistor and the resistance value of this resistor, the level shift voltage at a level shift stage can be controlled. The level of the differential output voltage is shifted by using the level shift voltage, a level shift output voltage is output from the level shift stage and the state of continuity of another NMOS transistor is controlled. The state of continuity of a PMOS transistor is controlled with the differential output voltage, and an amplified voltage is output through an output terminal.

19 Claims, 9 Drawing Sheets

OPERATIONAL AMPLIFIER

FIELD OF THE INVENTION

1. Background of the Invention

The present invention relates to an operational amplifier constituted of a semiconductor integrated circuit comprising, for instance, MOS field effect transistors (hereafter referred to as "FET") that is provided with a push/pull-type output stage constituted of a complementary MOSFET (hereafter referred to as a "CMOS") comprising a P-channel MOSFET (hereafter referred to as a "PMOS") and an N-channel MOSFET (hereafter referred to as a "NMOS") and the like.

2. Description of the Related Art

FIG. 2 is a circuit diagram presenting a structural example of an operational ampler provided with a push/pull-type output stage in the prior art.

This operational amplifier is provided with a differential stage 1 that amplifies the difference between a negative phase input voltage VIa and a positive phase input voltage VIb and outputs a differential output voltage VA, a level shift stage 2 that shifts the level of the differential output voltage VA with a specific level shift voltage and outputs a level shift output voltage VB and a push/pull-type output stage 3 that outputs an output voltage VO by engaging in an on/off operation using the differential output voltage VA and the level shift output voltage VB.

The differential stage 1 is provided with a negative phase input terminal 1a through which the negative phase input voltage VIa is input and a positive phase input terminal 1b through which the positive phase input voltage VIb is input, and these input terminals 1a and 1b are respectively connected to the gates of an NMOS 1c and an NMOS 1d. The sources of the NMOSs 1c and 1d are commonly connected to the drain of an NMOS 1e utilized as a constant current source. The source of the NMOS 1e is connected to the ground hereafter referred to as the "GND"), and a bias voltage VB1 is applied to the gate of the NMOS 1e. The drain of the NMOS 1c is connected to the drain and the gate of a PMOS if, and the source of the PMOS if is connected to a source potential (hereafter referred to as the "VDD"). The drain of the NMOS 1d is connected to the drain of a PMOS 1g through which the differential output voltage VA is output. The gate of the PMOS 1g is connected to the gate of the PMOS 1f, with the source of the PMOS 1g connected to the VDD.

The level shift stage 2 is provided with an NMOS 2a with its gate connected to the drain of the PMOS 1g and an NMOS 2b utilized as a constant current source to the gate of which a bias voltage VB2 is applied. The NMOSs 2a and 2b are connected in series between the VDD and the GND, with the level shift output voltage VB output through the connection point of the NMOSs 2a and 2b. The output stage 3 is provided with a PMOS 3a with its gate connected to the drain of the PMOS 1g and an NMOS 3b with its gate connected to the drain of the NMOS 2b. The PMOS 3a and the NMOS 3b are connected in series between the VDD and the GND. The drain of the PMOS 3a and the drain of the NMOS 3b are connected to an output terminal 3c through which the output voltage VO is output.

In an operational amplifier structured as described above, the negative phase input voltage VIa input to the negative phase input terminal 1a and the positive phase input voltage VIb input through the positive phase input terminal 1b cause the NMOSs 1c and 1d to engage in an on/off operation and the difference between the negative phase input voltage VIa and the positive phase input voltage VIb is amplified to be output as the differential output voltage VA through the drain of the PMOS 1g. The differential output voltage VA causes the NMOS 2a and the PMOS 3a to engage in an on/off operation. The on/off operation of the NMOS 2a causes a level shift in the differential output voltage VA, and, as a result, the level shift output voltage VB is output through the source of the NMOS 2a to cause the NMOS 3b to engage in an on/off operation. This, in turn, causes the amplified output voltage VO to be output through the output terminal 3c provided at the drain side of the NMOS 3b.

However, the operational amplifier in the prior art is yet to address the difficult problems discussed below with respect to power consumption and crossover distortion.

In the circuit structure illustrated in FIG. 2, the through current IS flowing from the VDD to the GND at the output stage 3 increases when the VDD is high and when the threshold voltages VT of the PMOS 3a and the NMOS 3b are low to result in wasteful consumption of power. When the VDD is low and the threshold voltages VT are high on the other hand, the through current IS becomes reduced to 0 to cause crossover distortion.

An example of wasteful consumption of power is now explained. For purposes of simplification, the explanation is given on the assumption that VDD=5V, threshold voltage VTP of PMOS 3a=1V and threshold voltage VTN of NMOS 3b=1V and that the current Ids between the drain and the source of the PMOS 3a is equal to the current Ids between the drain and the source of the NMOS 3b when the voltages Vgs between their gates and sources are equal to each other ILF indicates the current at the level shift stage 2 and VLF indicates the level shift voltage at the level shift stage 2. Assuming that the voltage Vgs (=VLF=VTN+alpha) between the gate and the source of the NMOS 2a required by the NMOS 2a to allow the current ILF to flow is approximately 1.2V, the voltage Vgs between the gate and the source of the NMOS 3b needs to satisfy Vgs=(VDD−VLF)/2=(5−1.2)/2=1.9V to ensure that the voltage Vgs between the gate and the source of the PMOS 3a and the voltage Vgs between the gate and the source of the NMOS 3b are equal to each other. Since the NMOS 3b constitutes a saturation area, the through current IS that travels through the output stage 3 from the VDD to the GND is calculated as follows through expression (1).

$$IS=\mu(Vgs\ at\ NMOS\ 3b-VTN)^2=\mu(1.9-1)^2=0.81\ \mu A \quad (1)$$

Next, let us consider a case in which VDD=6V, threshold voltage VTP of PMOS 3a=0.6V and threshold voltage VTN of NMOS 3b=0.6V. Assuming that alpha hardly changes, VLF is calculated to be approximately 0.8V, i.e., VLF=VTN+alpha=0.8V. The voltage Vgs between the gate and the source of the NMOS 3b needs to be Vgs=(6−0.8)/2=2.6V to set the Vgs between the gate and the source of the PMOS 3a and the voltage Vgs between the gate and the source of the NMOS 3b equal to each other, and in this situation, the through current IS is calculated as in the following expression (2).

$$IS=\mu(2.6-0.6)^2=4\ \mu A \quad (2)$$

In other words, under the conditions represented by the expressions (1) and (2), the through current IS at the output stage 3 changes by a factor of 4.94.

When we consider a situation in which VDD=3V, threshold voltage VTP of PMOS 3a V, threshold voltage VTN of NMOS 3b=IV and the voltage Ids between the drain and the source of the PMOS 3a is equal to the voltage Ids between the drain and the source of the NMOS 3b when the voltages Vgs between their gates and sources are equal to each other, as an example in which crossover distortion occurs, VLF is calculated to be approximately 1.2V, i.e., VLF=VTN+alpha= 1.2V. The voltage Vgs between the gate and the source of the NMOS 3b needs to be Vgs=(VDD−VLF)/2=(3−1.2)/2=0.9V to set the voltage Vgs between the gate and the source of the PMOS 3a and the voltage Vgs between the gate and the source of the NMOS 3b equal to each other. Since the gate/source voltage Vgs at NMOS 3b<VTN in this situation, the through current IS does not flow at the output stage 3 and crossover distortion occurs.

SUMMARY OF THE INVENTION

An object of the present invention is to provide an operational amplifier that can be operated at low power consumption without generating crossover distortion by addressing the problems of the prior art discussed above.

In order to achieve the object described above, a first aspect of the present invention provides an operational amplifier comprising a bias circuit having a first resistor connected in series between a first source potential and a second source potential that generates and outputs a bias voltage through a reduction in the voltage at the first resistor, a differential stage that amplifies the difference between a first input voltage and a second input voltage and outputs a differential output voltage, a level shift stage having a first transistor which is connected in series to a second resistor and supplies a constant current with the state of continuity of the transistor controlled by the bias voltage, that shifts the level of the differential output voltage using a level shift voltage which is controlled by the product of the current flowing through the second resistor and the second resistance value and a push/pull-type output stage having a second transistor connected between the first source potential and an output node, whose state of continuity is controlled by the differential output voltage and a third transistor connected between the output node and the second source potential, whose state of continuity is controlled by the level shift output voltage.

According to a second aspect of the present invention, in the operational amplifier in the first aspect, the level shift stage is provided with a fourth transistor connected between the first source potential and a first node, whose state of continuity is controlled by the differential output voltage, the second resistor connected between the first node and a second node, through which the level shift output voltage is output and the first transistor connected between the second node and the second source potential, whose state of continuity is controlled by the bias voltage.

In a third aspect of the present invention, the level shift stage in the operational amplifier in the first aspect is provided with the second resistor connected between a first node through which the differential output voltage is input and a second node through which the level shift output voltage is output and the first transistor connected between the second node and the second source potential, whose state of continuity is controlled by the bias voltage.

In a fourth aspect of the present invention, the first transistor, the second transistor and the third transistor in the operational amplifier according to the first, second or third aspect are each constituted of a FET.

By adopting such a structure, the bias voltage generated at the bias circuit is supplied to the first transistor so that the first transistor operates as a constant current source. When the first input voltage and the second input voltage are input to the differential stage, the difference between the first and second input voltages is amplified and the differential output voltage is output. The level of the differential output voltage is shifted at the level shift stage, and the level shift output voltage is supplied to the output stage. At the output stage, where the state of continuity of the second transistor is controlled by the differential output voltage supplied by the differential stage and the state of continuity of the third transistor is controlled by the level shift output voltage supplied by the level shift stage, the output voltage of the operational amplifier is output through the output node of the output stage.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

First Embodiment

Figure 1:
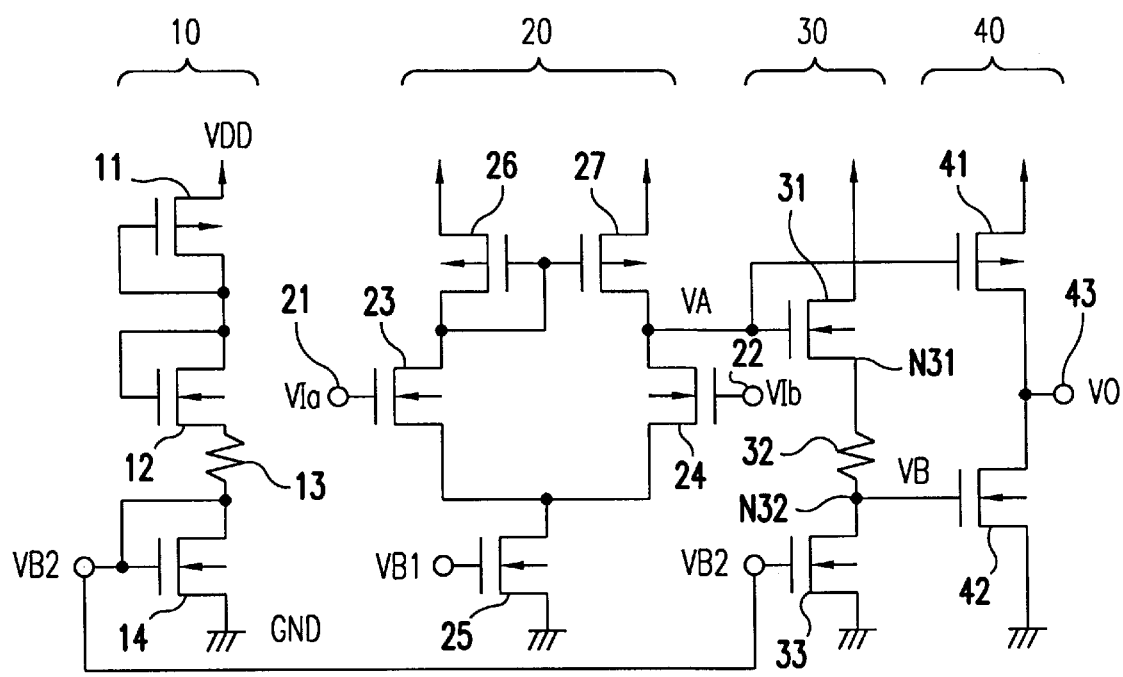
FIG. 1 is a circuit diagram of the operational amplifier in a first embodiment of the present invention.

FIG. 1 is a circuit diagram of the operational amplifier in the first embodiment of the present invention.

This operational amplifier is constituted of a CMOS LSI with VDD set at approximately 3V or higher, comprising, for instance, a bias circuit 10 that generates and outputs a bias voltage VB2, a differential stage 20 that amplifies the difference between a first input voltage (e.g., a negative phase input voltage) Via and a second input voltage (e.g., a positive phase input voltage) VIb and outputs a differential output voltage VA, a level shift stage 30 that shifts the level of the differential output voltage VA using a specific level shift voltage VLF and outputs a level shift output voltage VB and a push/pull-type output stage 40 that outputs an output voltage VO by engaging in an on/off operation using the differential output voltage VA and the level shift output voltage VB.

The bias circuit 10 is provided with a PMOS 11 with its source connected to a first source potential (e.g., the VDD) and its drain and gate commonly connected. The drain and the gate of an NMOS 12 are connected to the drain of the PMOS 11, and the source of the NMOS 12 is connected to one end of a first resistor 13. The drain and the gate of an NMOS 14 are connected to the other end of the resistor 13, and the source of the NMOS 14 is connected to a second source potential (e.g., the GND) to output a bias voltage VB2 through the gate of the NMOS 14.

The differential stage 20 is provided with a negative phase input terminal 21 through which the negative phase input voltage VIa is input and a positive phase input terminal 22 through which the positive phase input voltage VIb is input, with the gates of NMOSs 23 and 24 respectively connected to the input terminals 21 and 22. The source of the NMOS 23 and the source of the NMOS 24 are commonly connected to the drain of an NMOS 25 operating as a constant current source, and with the source of the NMOS 25 connected to the GND, a specific bias voltage VB1 is applied to its gate. The drain of the NMOS 23 is connected to the drain and the gate of a PMOS 26, and the source of the PMOS 26 is connected to the VDD. The gate of a PMOS 27 is connected to the gate of the PMOS 26, and the source of the PMOS 27 is connected to the VDD with its drain connected to the drain of the NMOS 24 to allow the differential output voltage VA to be output through the drain of the PMOS 27.

The level shift stage 30 is provided with a fourth transistor (e.g., an NMOS) 31 whose gate is connected to the drain of the PMOS 27, whose drain is connected to the VDD and whose source is connected to a first node N31. The node N31 is connected to one end of a second resistor 32, with the other end of the resistor 32 connected to a second node N32. The drain of a first transistor (e.g., an NMOS) 33 utilized as a constant current source is connected to the node N32, the source of the NMOS 33 is connected to the GND and the bias voltage VB2 is applied to the gate of the NMOS 33, to allow the level shift output voltage VB to be output through the node N32.

The output stage 40 is provided with a second transistor (e.g., a PMOS) 41 whose state of continuity is controlled by the differential output voltage VA and a third transistor (e.g., an NMOS) 42 whose state of continuity is controlled by the level shift output voltage VB, which are connected in series between the VDD and the GND. The drain of the PMOS 41 and the drain of the NMOS 42 are connected with an output terminal 43 through which the output voltage VO is output.

Next, the operation of the operational amplifier illustrated in FIG. 1 is explained.

When the VDD is applied, the bias voltage VB2 is output through the gate of the NMOS 14 in the bias circuit 10 and is applied to the gate of the NMOS 33 in the level shift stage 30, causing the NMOS 33 to operate as a constant current source. In addition, when a bias voltage VB1, which is supplied from a circuit (not shown) is applied to the gate of the NMOS 25 in the differential stage 20, the NMOS 25 operates as a constant current source. When the negative phase input voltage VIa is input to the negative phase input terminal 21 and the positive phase input voltage VIb is input to the positive phase input terminal 22, the difference between these input voltages Via and VIb is amplified at the differential stage 20 and the differential output voltage VA is output through the drain of the PMOS 27. This differential output voltage VA controls the state of continuity of the NMOS 31 in the level shift stage 30, the level of the differential output voltage VA is shifted by the specific level shift voltage VLF and the level shift output voltage VB resulting from the shift is output through the node N32. At the output stage 40, where the state of continuity of the PMOS 41 is controlled by the differential output voltage VA and the state of continuity of the NMOS 42 is controlled by the level shift output voltage VB, the amplified output voltage VO is output through the output terminal 43.

In the explanation, W and L, for instance, are used to respectively indicate the gate width and the gate length of a MOSFET and, in addition, for purposes of simplification, the current Ids between the drain and the source of the MOSFET in the saturated state is approximated to Ids=$\mu$ (Vgs–VT)2. When the dimensions W/L of the PMOS 11 and the NMOSs 12 and 14 are set at sufficiently large values at the bias circuit 10, the voltage achieved by subtracting their threshold voltages VT from the VDD is applied to the two ends of the resistor 13. The current IB flowing through the bias circuit 10 at this point is expressed as;

$$IB = (VDD - VTP - VTN - VTN - delta)/R13$$
$$= (VDD - VTP - VTN - VTN)/R13$$

VTP indicates the threshold voltage VT of the PMOS 11, VTN indicates the threshold voltages VT of the NMOSs 12 and 14 and R13 indicates the resistance value of the resistor 13. While delta is necessary to supply the current IB to the bias circuit 10 by turning on the PMOS 11 and the NMOSs 12 and 14, it is considerably lower than the VDD when the dimensions W/L of the individual MOSFETs are sufficiently large and, therefore, it is disregarded in this discussion. In addition, the level shift voltage VLF at the level shift stage 30 is expressed as;

$$VLF = VTN + alpha + R32*ILF$$
$$= VTN + alpha + R32*(VDD - VTP - 2*VTN)/R13$$
$$= (VDD - VTP)*R32/R13(2*R32/R13 - 1)*VTN + alpha$$

R32 indicates the resistance value at the resistor 32 and ILF indicates the current at the level shift stage 30. While alpha is necessary to turn on the NMOS 33, it is considerably lower than VDD when the dimensions W/L of the NMOS 33 are sufficiently large and, therefore, it is disregarded in this discussion. As these expressions clearly indicate, when the VDD is high and when the threshold voltages VTP and VTN are low, the level shift voltage VLF can be set at a high level by adjusting the resistance value R32 of the resistor 32 and the resistance value R13 of the resistor 13 to prevent any increase in the through current IS flowing through the output stage 40 from the VDD to the GND.

In particular, the through current IS at the output stage 40 can be controlled with ease by setting the dimensions W/L of the individual MOSFETs and the resistance values to achieve PMOS 41: PMOS 11=NMOS 42: NMOS 14 and NMOS 14: NMOS 33=NMOS 12: NMOS 31=R13: R32, since this will set the through current IS at a constant multiple of the current IB traveling through the bias circuit 10. To explain a situation in which PMOS 41=PMOS 11, NMOS 42=NMOS 14=NMOS 33, NMOS 12=NMOS 31 and R13=R32 for purposes of simplification, since the current IB at the bias circuit 10 and the current ILF at the level shift stage 30 are equal to each other even when alpha and delta mentioned above cannot be disregarded, the level shift voltage VLF is calculated as: level shift voltage VLF= gate voltage Vg of PMOS 41—gate voltage Vg of NMOS 42=gate voltage Vg of PMOS 11—gate voltage Vg of NMOS 14. In other words, in this situation, the through current IS at the output stage 40 and the through current IB at the bias circuit 10 are equal to each other. For instance, when PMOS 41/PMOS 11=NMOS 42/NMOS 14=5, NMOS 14=NMOS 33, NMOS 12/NMOS S31 and R32=R13, the through current IS at the output stage 40 is a multiple of the through current IB at the bias circuit 10 by a factor of 5.

As explained above, the following advantages are achieved in this embodiment.

When we consider a situation in which VDD=5V, VTP=1V, VTN=1V, delta=0.42, PMOS 41=PMOS 11, NMOS 42=NMOS 14=NMOS 33, NMOS 12=NMOS 31 and R32=R13=10,000 Ω as an example in which an improvement is achieved in the power consumption, $$IB = (VDD - VTP - VTN - VTN - delta)/R13 \quad (3)$$
$$= (5 - 1 - 1 - 1 - 0.42)/R13$$
$$= 1.58/10,000 = 0.158 \, mA$$
$$IS = IB = 0.158 \, mA$$

Likewise, in a situation in which VDD=6V, VTP=0.6V, VTN=0.6V, delta=0.6, PMOS 41=PMOS 11, NMOS 42=NMOS 14=NMOS 33, NMOS 12=NMOS 31 and R32=R13=10,000 Ω, $$IB = (VDD - VTP - VTN - VTN - delta)/R13 \quad (4)$$
$$= (6 - 0.6 - 0.6 - 0.6 - 0.6)/R13$$
$$= 3.6/10,000 = 0.36 \, mA$$
$$IS = IB = 0.36 \, mA$$

Figure 2:
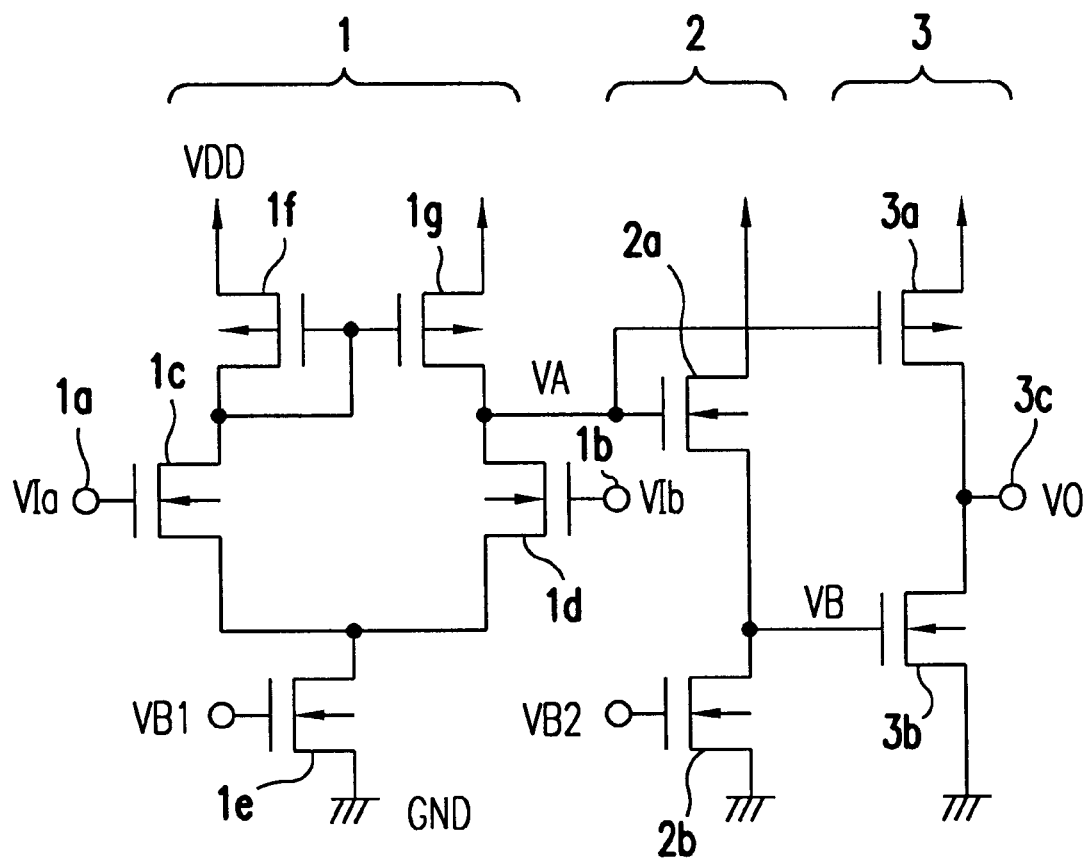
FIG. 2 is a circuit diagram of an operational amplifier in the prior art.

Namely, in spite of the difference in the conditions under which expressions (3) and (4) are calculated, the through current IS at the output stage 40 increases to a value that is a multiple by a factor of only 2.28. Since the through current increases to a value which is a multiple by a factor of 4.94 under the same conditions in the case of the circuit in the prior art illustrated in FIG. 2, the increase in the through current IS at the output stage 40 is reduced by more than half.

In addition, the level shift voltage VLF, which can be varied by adjusting the resistor 32 and the current ILF at the level shift stage 30, can be reduced to enable drive of a large load or can be increased to reduce the through current IS. While R32=R13=10,000 Ω in the examples given above, R32 may be set to 6,000 Ω to lower the level shift voltage VLF, whereas R13 may be set to 14,000 Ω to raise the level shift voltage VLF.

Second Embodiment

Figure 3:
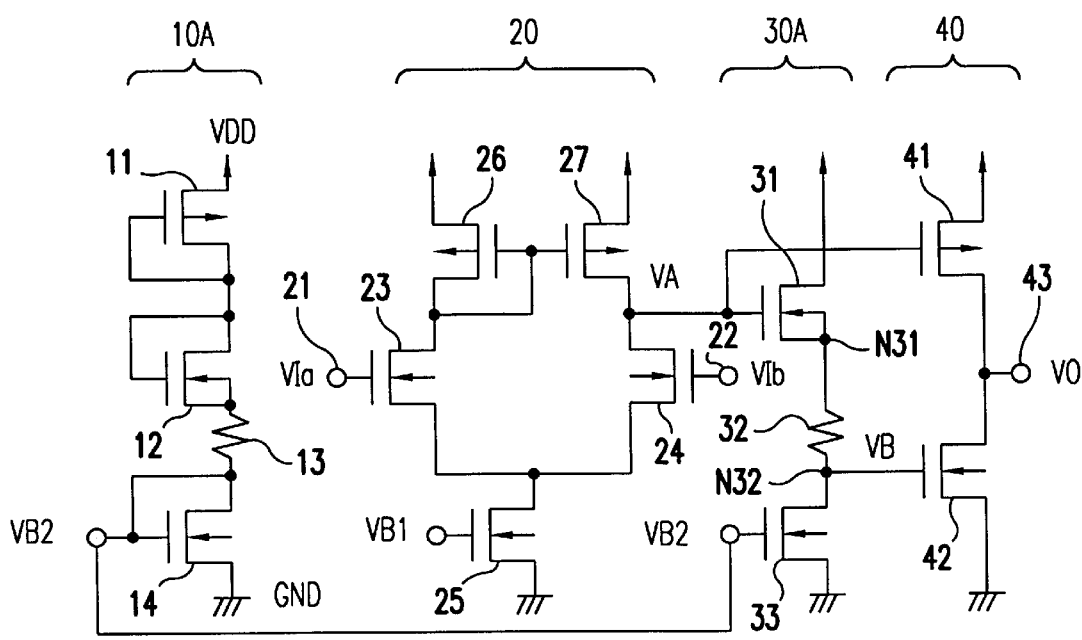
FIG. 3 is a circuit diagram of the operational amplifier in a second embodiment of the present invention.

FIG. 3 is a circuit diagram of the operational amplifier in the second embodiment of the present invention, with the same reference numbers assigned to elements identical to the elements shown in FIG. 1 illustrating the first embodiment.

This operational amplifier, which is constituted of a CMOS LSI with a VDD at approximately 3V or higher, as in the first embodiment, differs from the operational amplifier in the first embodiment in that the bulk of the NMOS 12 at a bias circuit 10A is connected to the source and the bulk of the NMOS 31 at a level shift stage 30A is connected to the source.

While the operational amplifier in the second embodiment engages in an operation that is basically similar to that performed in the first embodiment, the threshold voltages VT of the NMOS 12 at the bias circuit 10A and the NMOS 31 at the level shift stage 30A are not affected by the back bias effect. Thus, in addition to advantages that are similar to those achieved in the first embodiment, the operational amplifier in the second embodiment is expected to achieve the following additional advantages.

Since the fluctuation of the threshold voltage VT of the NMOS 31 is suppressed by the back bias effect occurring when a fluctuation manifests in the source voltage Vs at the NMOS 31, the fluctuation of the level shift voltage VLF at the level shift stage 30A is inhibited. In addition, while the bias circuit 10 in the first embodiment does not operate when VDD<threshold voltage VTP of PMOS 11+threshold voltage VTN of NMOS 12+threshold voltage VTN of NMOS 14 since the current IB does not flow under those circumstances, the minimum VDD at which the operational amplifier in the first embodiment operates in a normal manner is raised if the threshold voltages VT increase due to the back bias effect. In other words, the operational amplifier in the second embodiment is capable of operating at a VDD that is lower than that required in the first embodiment.

Third Embodiment

Figure 4:
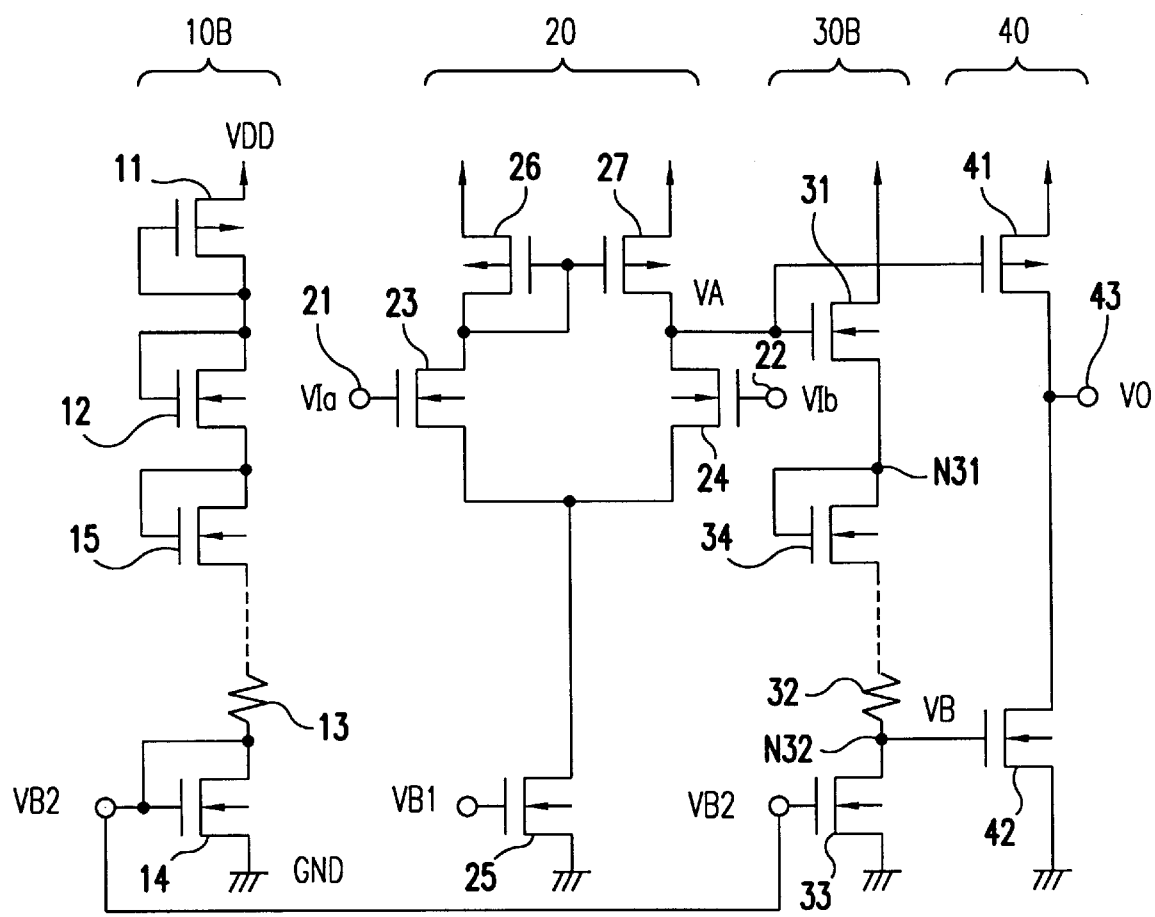
FIG. 4 is a circuit diagram of the operational amplifier in a third embodiment of the present invention.

FIG. 4 is a circuit diagram of the operational amplifier in the third embodiment of the present invention, with the same reference numbers assigned to elements identical to the elements shown in FIG. 1 illustrating the first embodiment.

In this operational amplifier, which may be constituted of, for instance, a CMOS LSI with a VDD at approximately SV or higher, a bias circuit 10B and a level shift stage 30B having different structures from those of the bias circuit 10 and the level shift stage 30 in the first embodiment are provided in place of the bias circuit 10 and the level shift stage 30 respectively. The bias circuit 10B, which is provided with a PMOS 11, NMOSs 12 and 14 and the resistor 13 as in the first embodiment, is further provided with n NMOSs 15 connected in series between the NMOS 12 and the resistor 13, with their gates and drains commonly connected. The level shift stage 30B, which is provided with NMOSs 31 and 33 and a resistor 32 that are identical to those employed in the first embodiment, is further provided with n NMOSs 34 connected in serious between the NMOS 31 and the resistor 32, with their gates and drains commonly connected. Other structural features are identical to those in the first embodiment.

Next, the operation of the operational amplifier illustrated in FIG. 4 is explained.

The current IB flowing through the bias circuit 10B is expressed as;

$$IB=(VDD-VTP-VTN-VTN-n*VTN-delta)/R13$$

While delta is necessary to allow the current IB to flow by turning on the PMOS 11, the two NMOSs 12 and 14 and the n NMOSs 15, it is considerably lower than the VDD when the dimensions W/L of the individual MOSFETs are sufficiently large. In addition, the level shift voltage VLF is expressed as;

$$VLF=VTN+n*VTN+alpha+R32*ILF$$

While alpha is necessary to turn on the NMOS 33 and the n NMOSs 34, it is considerably lower than the VDD when the dimensions W/L of the individual MOSFETs are sufficiently large. In other words, even when the same resistor 32 and the same current ILF are used, a level shift voltage VLF, which is larger than the level shift voltage VLF in the first embodiment by the quantity corresponding to the threshold voltages VTN of the n NMOSs 34, is achieved.

As explained above, the following advantages are achieved in this embodiment.

(i) Since the current ILF at the level shift stage 30B changes in such a manner that the bias circuit 101 absorbs fluctuations of the threshold voltage VT and the VDD, the operational amplifier in the embodiment is expected to achieve advantages similar to those achieved in the first embodiment.

(ii) Since the resistance values at the resistors 32 and 13 that are required to achieve a level shift voltage VLF equal to that achieved in the first embodiment can be reduced, the areas required for the formation of the resistors 13 and 32 in the LSI pattern can be reduced when constituting the operational amplifier in the embodiment with, for instance, a large scale integrated circuit (LSI). Alternatively, the current IB required at the bias circuit 10B and the current ILF required at the level shift stage 30B can be reduced.

Fourth Embodiment

Figure 5:
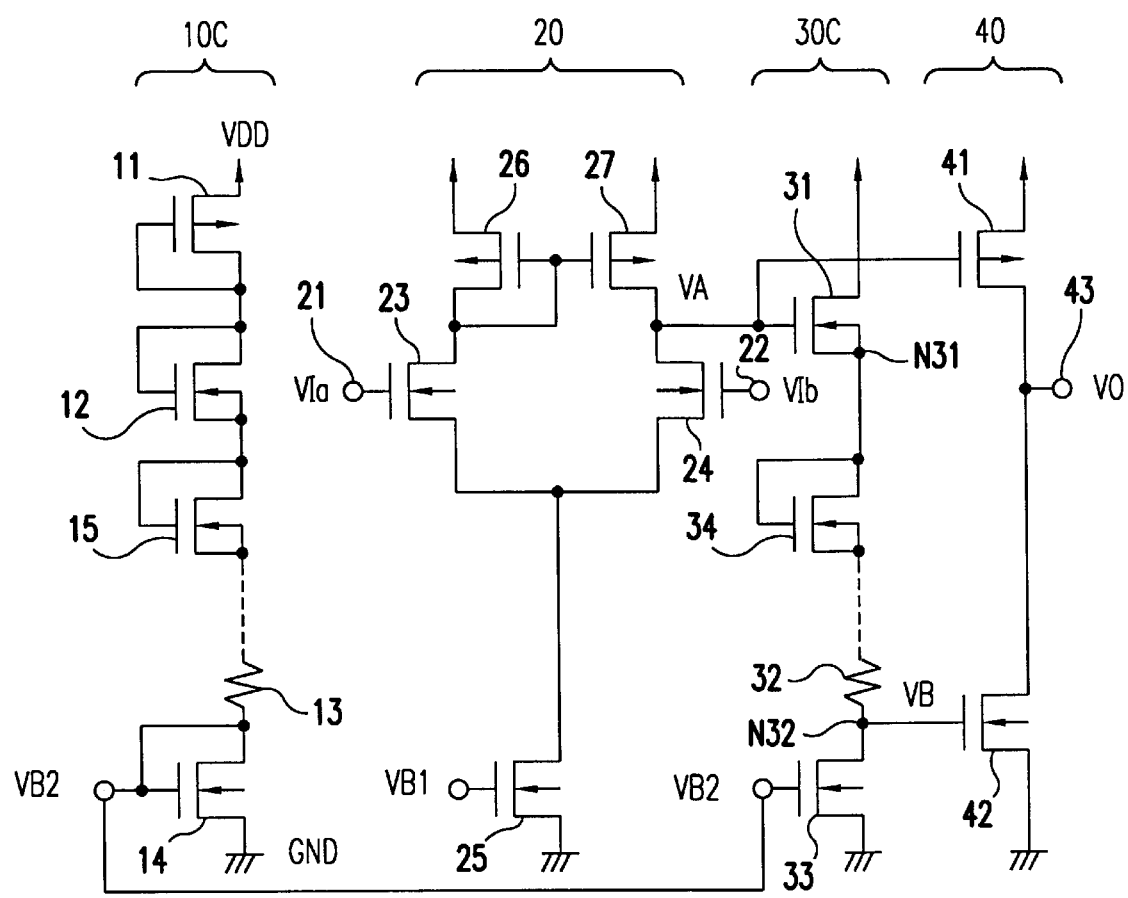
FIG. 5 is a circuit diagram of the operational amplifier in a fourth embodiment of the present invention.

FIG. 5 is a circuit diagram of the operational amplifier in the fourth embodiment of the present invention, with the same reference numbers assigned to elements identical to the elements shown in FIG. 4 illustrating the third embodiment.

In this operational amplifier, which may be constituted of a CMOS LSI with a VDD at approximately 5V or higher as in the third embodiment, a bias circuit 10C and a level shift stage 30C having different structures from those of the bias circuit 10B and the level shift stage 30B in the third embodiment are provided in place of the bias circuit 10B and the level shift stage 30B respectively. The bias circuit 10C, which assumes a structure almost identical to that of the bias circuit 10B in the third embodiment, only differs from the bias circuit 10B in that the individual bulks of the single NMOS 12 and the n NMOSs 15 are connected with the respective sources. In addition, the level shift stage 30C, which assumes a structure almost identical to that of the level shift stage 30B in the third embodiment, differs from the level shift stage 30B only in that the bulks of the single NMOS 31 and the n NMOSs 34 are connected to the respective sources. Other structural features are identical to those of the third embodiment.

While the operation achieved in this embodiment is similar to that performed in the third embodiment, it differs from the operation in the third embodiment only in that the threshold voltages VT of the single NMOS 12 and the n NMOSs 15 at the bias circuit 10C and the threshold voltages VT of the single NMOS 31 and the n NMOSs 34 at the level shift stage 30C are not affected by the back bias effect.

Consequently, the embodiment achieves the following advantages.

(a) Since the back bias effect occurring when the source voltage Vs at the NMOS 31 fluctuates, fluctuations of the threshold voltages VT of the single NMOS 31 and the n NMOSs 34 is prevented and the level shift voltage VLF at the level shift stage 30C is also prevented from fluctuating.

(b) While the bias circuit 10B in the third embodiment does not operate when VDD<VTP+VTN+VTN+ . . . +VTN, since the current IB does not flow under these conditions, the minimum VDD that allows a normal operation to be achieved in the third embodiment is raised if the threshold voltages VT increases due to the back bias effect. In contrast, an operation is possible in this embodiment at VDD lower than that required in the third embodiment.

Fifth Embodiment

Figure 6:
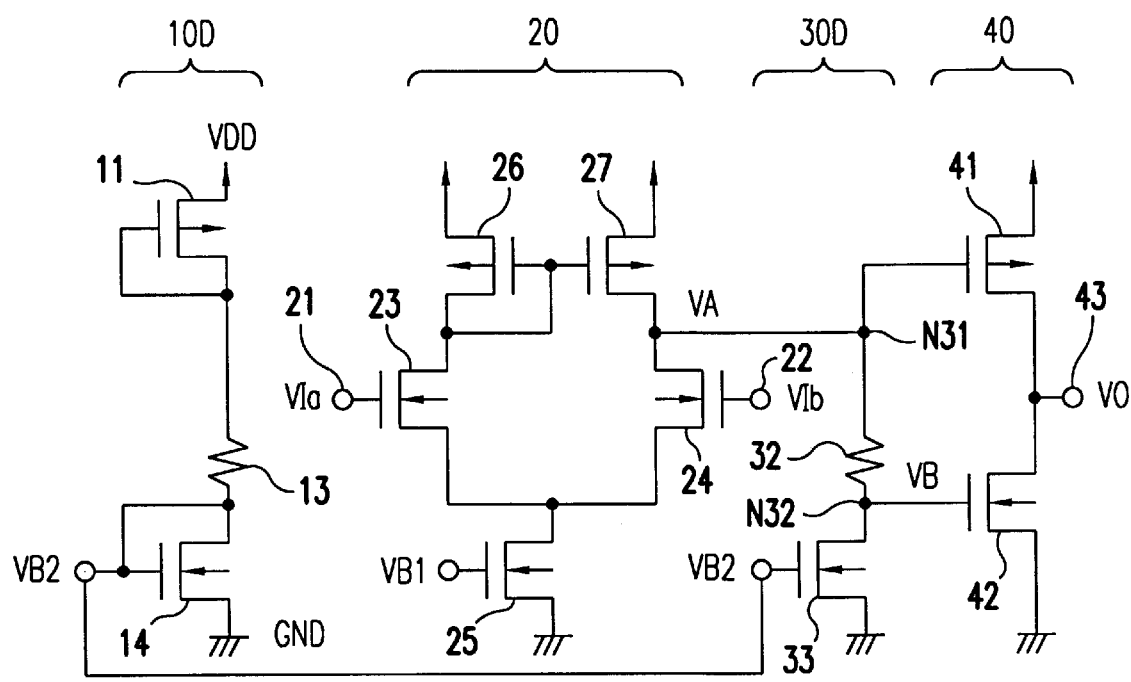
FIG. 6 is a circuit diagram of the operational amplifier in a fifth embodiment of the present invention.

FIG. 6 is a circuit diagram of the operational amplifier in the fifth embodiment of the present invention, with the same reference numbers assigned to elements that are identical to the elements shown in FIG. 1 illustrating the first embodiment.

In this operational amplifier, which may be constituted of, for instance, a CMOS LSI with a VDD at approximately 2V or higher, a bias circuit 10D and a level shift stage 30D having structures different from those of the bias circuit 10 and the level shift stage 30 in the first embodiment are provided in place of the bias circuit 10 and the level shift stage 30 respectively.

The bias circuit 10D assumes a structure achieved by eliminating the NMOS 12 in the bias circuit 10. Namely, the bias circuit 10D is provided with an NMOS 11, a resistor 13 and an NMOS 14 that are connected in series between the VDD and the GND. The level shift stage 30D assumes a structure achieved by eliminating the NMOS 31 in the level shift stage 30. Namely, the level shift stage 30D is provided with a first node N31 connected to the drain of the PMOS 27 at the differential stage 20, with one end of the resistor 32 connected to the node N31 and the other end of the resistor 32 connected to a second node N32. The node N32 is connected to the drain of the NMOS 33, whereas its source is connected to the GND. The node N31 is connected to the gate of the PMOS 41 at the output stage 40, and the node N32 is connected to the gate of the NMOS 42 at the output stage 40. Other structural features are identical to those in the first embodiment.

Next, the operation achieved in this embodiment is explained.

When the dimensions W/L of the PMOS 11 and the NMOS 14 at the bias circuit 10D are set at sufficiently large values, the voltage achieved by subtracting their threshold voltages VT from the VDD is applied to the two ends of the resistor 13. The current IB flowing through the bias circuit 10D at this point is expressed as;

$$IB = (VDD - VTP - VTN - VTN*delta)/R13$$
$$= (VDD - VTP - VTN - VTN)/R13$$

While delta is necessary to allow the current IS to flow by turning on the PMOS 11 and the NMOS 14, it is considerably lower than the VDD when the dimensions W/L of the individual MOSFETs are sufficiently large and, therefore, it is disregarded in this discussion. In addition, the level shift voltage VLF is expressed as;

$$VLF=R32*ILF-R32*(VDD-VTP-VTN)/R13$$

As these expressions clearly indicate, when the VDD is high and when the threshold voltages VTP and VTN are low, the level shift voltage VLF can be set at a high level by adjusting the resistance value R32 of the resistor 32 and the resistance value R13 of the resistor 13 to prevent an increase in the through current IS at the output stage 40.

In particular, the through current IS at the output stage 40 can be controlled with ease by setting the dimensions W/L of the individual MOSFETs and the resistance values to achieve PMOS 41: PMOS 11=NMOS 42: NMOS 14 and NMOS 14: NMOS 33=R13: R32, since this will set the through current IS at the output stage 40 at a constant multiple of the current IB traveling through the bias circuit 10D.

To explain a situation in which PMOS 41=PMOS 11, NMOS 42=NMOS 14=NMOS 33 and R13=R32 for purposes of simplification, since the current IB at the bias circuit 10D and the current ILF at the level shift stage 30D are equal to each other even when delta mentioned above cannot be disregarded, the level shift voltage VLF is calculated as level shift voltage VLF=gate voltage Vg of PMOS 41−gate voltage Vg of NMOS 42=gate voltage Vg of PMOS 11−gate voltage Vg of NMOS 14. In other words, in this situation, the through current IS at the output stage 40 and the through current IB at the bias circuit 10D are equal to each other. For instance, when PMOS 41/PMOS 11=NMOS 42/NMOS 14=5, NMOS 14=NMOS 33 and R32=R13, the through current IS at the output stage 40 is a multiple of the through current IB at the bias circuit 10D by a factor of 5.

As explained above, the embodiment achieves an advantage of inhibiting the through current IS at the output stage 40 as does the first embodiment. In addition, since the threshold voltage VTN term is eliminated from the expression of the level shift voltage VLF, another advantage is achieved in that a normal operation is possible under conditions that would cause crossover distortion in the circuit in the prior art with VDD=3V, threshold voltage VTP=1V and threshold voltage VTN=1V.

Sixth Embodiment

Figure 7:
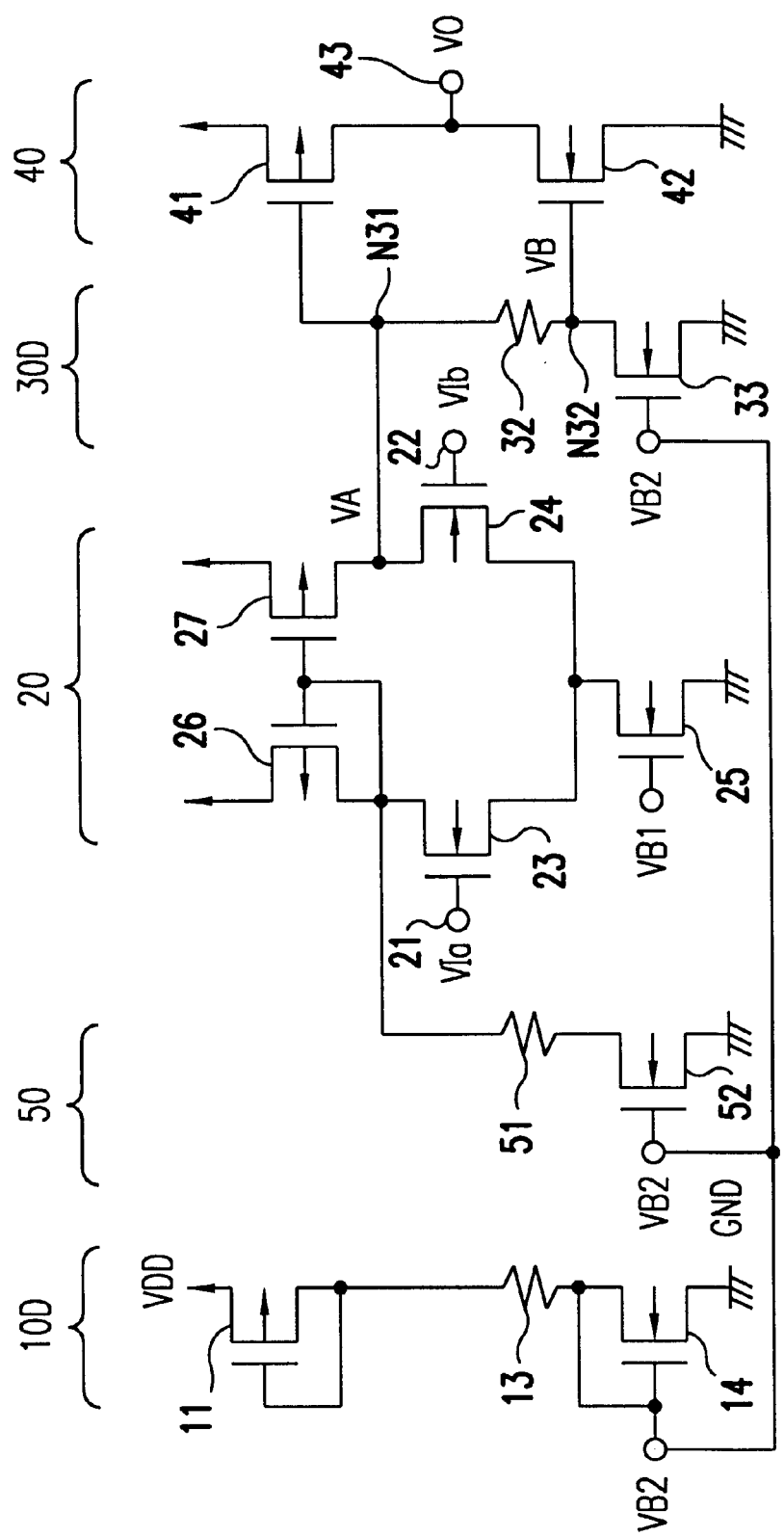
FIG. 7 is a circuit diagram of the operational amplifier in a sixth embodiment of the present invention.

FIG. 7 is a circuit diagram of the operational amplifier in the sixth embodiment of the present invention, with the same reference numbers assigned to elements identical to the elements shown in FIG. 6 illustrating the fifth embodiment.

This operational amplifier, which is constituted of a CMOS LSI with a VDD at approximately 2V or higher as is the operational amplifier in the fifth embodiment, is achieved by adding a current correction stage 50 to the fifth embodiment. The current correction stage 50 is constituted of a resistor 51 and an NMOS 52, with one end of the resistor 51 connected to the drain of the PMOS 26 at the differential stage 20. The other end of the resistor 51 is connected to the drain of the NMOS 52, and the source of NMOS 52 is connected to the GND. The gate of the NMOS 52 is connected to the gate of the NMOS 14 so that the bias voltage VB2 can be applied. In addition, the resistance value R32 of the resistor 32, the resistance value R51 of the resistor 51, the dimensions of the NMOS 33 and the dimensions of the NMOS 52 are adjusted so that the same current flows.

While the operations performed by the bias circuit 10D and the level shift stage 30D in the embodiment are almost identical to those performed in the fifth embodiment, the sixth embodiment differs from the fifth embodiment only in that with the addition of the current correction stage 50, the currents flowing on the left and on the right of the differential stage 20 are equalized.

As a result, the following advantage is achieved in the embodiment.

Since the current flows into the level shift stage 30D from the differential output voltage VA at the differential stage 20 in the fifth embodiment, there is a difference between the current at the PMOS 26 and the current at the PMOS 27 in the level sift stage 20, which results in a large offset. In contrast, since the currents on the left and on the right of the differential stage 20 are set equal to each other by the current correction stage 50 in the embodiment, the offset is reduced.

Seventh Embodiment

Figure 8:
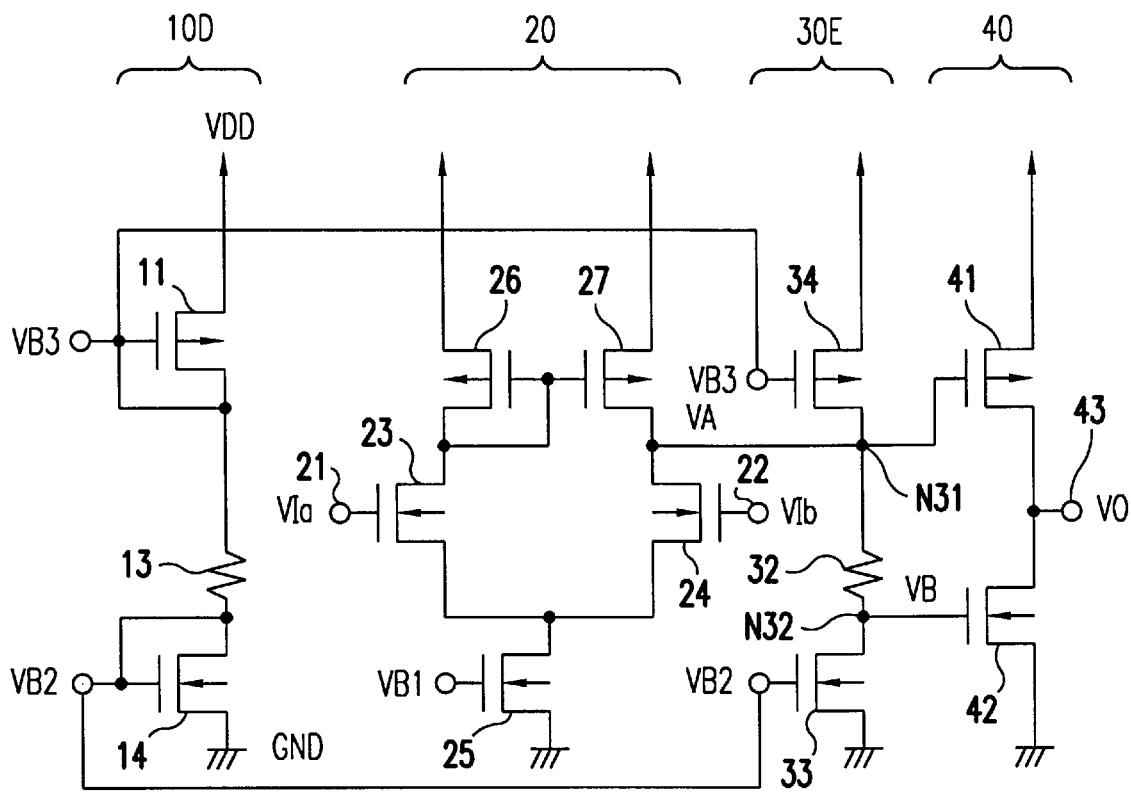
FIG. 8 is a circuit diagram of the operational amplifier in a seventh embodiment of the present invention.

FIG. 8 is a circuit diagram of the operational amplifier in the seventh embodiment of the present invention, with the same reference numbers assigned to elements identical to the elements shown in FIG. 6 illustrating the fifth embodiment.

This operational amplifier, which is constituted of a CMOS LSI with a VDD set at approximately 2V or higher, as is the operational amplifier in the fifth embodiment, is provided with a level shift stage 30E in place of the level shift stage 30D in the fifth embodiment, assuming a different structure from that of the level shift stage 30D. The level shift stage 30E adopts a structure achieved by adding a PMOS 34 to the level so 30D in the fifth embodiment. The drain of the PMOS 34 is connected to the first node N31, its source is connected to the VDD and its gate is connected to the gate of the PMOS 11 at the bias circuit 101) so that a bias voltage VB3 is applied. Other structural features are identical to those adopted in the fifth embodiment.

While the operation achieved in this embodiment is basically similar to that performed in the fifth embodiment, the current flowing through the PMOS 34 and the current flowing through the NMOS 33 can be equalized by setting the dimensions W/L of the MOSFETs constituting the bias circuit 10D and the level shift stage 30E and the resistance values by ensuring that PMOS 11: PMOS 34=NMOS 14: NMOS 33=R13: R32.

Thus, the embodiment achieves similar advantages to those achieved in the fifth embodiment. Furthermore, by equalizing the currents flowing through the PMOS 34 and the NMOS 33, it is possible to ensure that no current flows from the differential stage 20 into the level shift stage 30E. This, in turn, makes it possible to suppress the offset that would otherwise occur due to the imbalance of the currents flowing on the left and the right of the differential stage 20.

Eighth Embodiment

Figure 9:
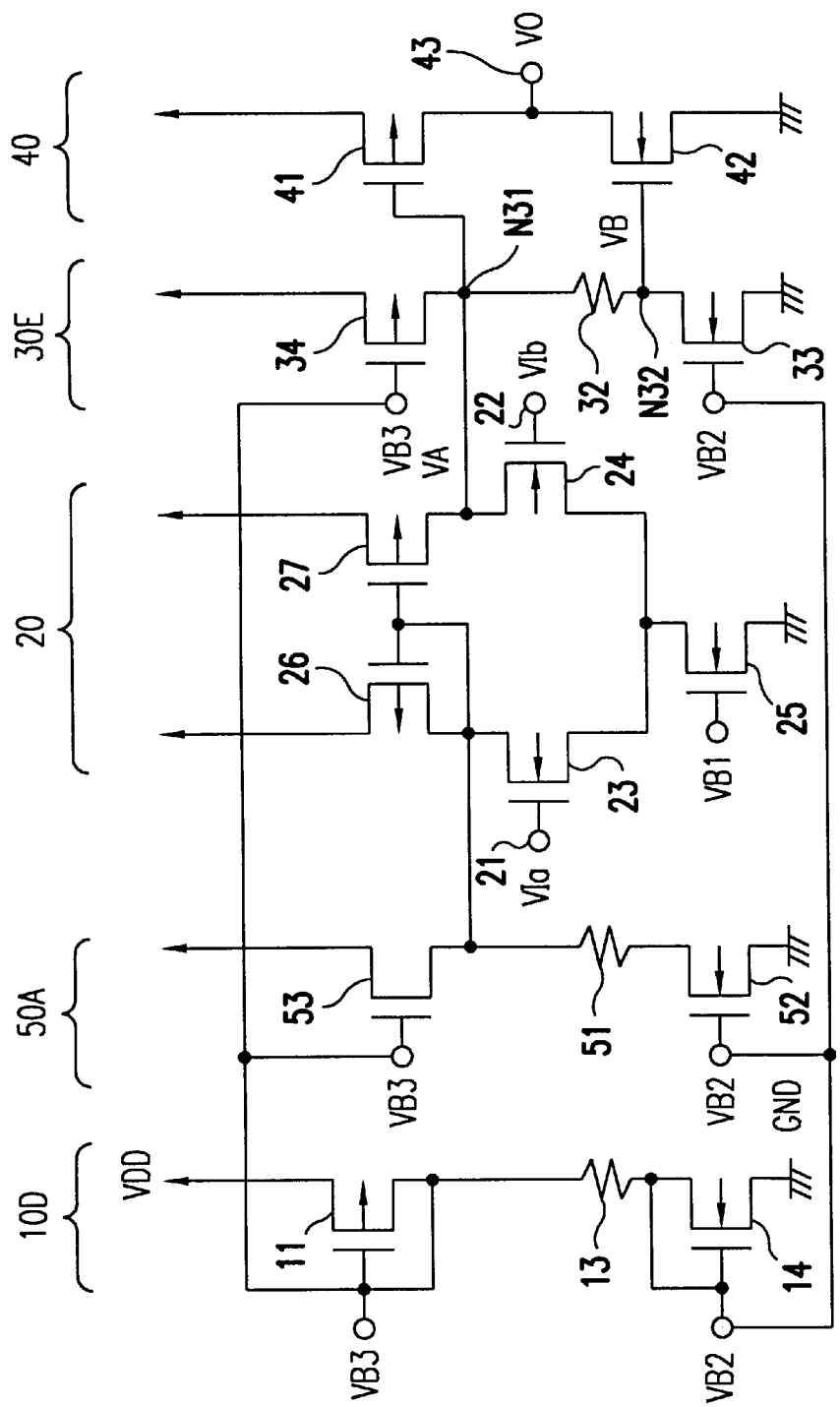
FIG. 9 is a circuit diagram of the operational amplifier in an eighth embodiment of the present invention.

FIG. 9 is a circuit diagram of the operational amplifier in the eighth embodiment of the present invention, with the same reference numbers assigned to elements that are identical to the elements shown in FIG. 8 illustrating the seventh embodiment.

This operational amplifier, which is constituted of a CMOS LSI with a VDD set at approximately 2V or higher as is the operational amplifier in the seventh embodiment, is achieved by adding a current correction stage 50A to the structure adopted in the seventh embodiment. The current correction stage 50A is provided with a PMOS 53 whose gate is connected to the gate of the PMOS 11, a resistor 51 and an NMOS 52 whose gate is connected to the gate of the NMOS 14, which are connected in series between the VDD and the GND. While the current correction stage 50A assumes a structure similar to that of the level shit stage 30E, the drain of the PMOS 53 is connected to the drain of the PMOS 26 at the differential stage 20.

While an operation which is almost identical to that performed in the sixth embodiment illustrated in FIG. 7 is achieved in this embodiment, the differential output voltage VA at the differential stage 20 and the level shift output voltage VB at the level shift stage 30E can be set higher than those in the sixth embodiment since a current is supplied via the PMOS 34. In addition, the level can be adjusted by controlling the dimensions W/L of the PMOS 34. For instance, by making settings to ensure that PMOS 34=PMOS 53, resistance value R32 of resistor 32=resistance value R51 of resistor 51 and NMOS 33=NMOS 52, the currents on the left and on the right of the differential stage 20 can be balanced.

Consequently, advantages almost identical to those achieved in the sixth embodiment are realized. Furthermore, since the level shift output voltage VB can be set to a high level, the gate voltage Vg at the NMOS 42 of the output stage 40 can be raised to enable the NMOS 42 to drive a large load. Moreover, since the currents on the left and the right of the differential stage 20 can be balanced, the offset voltage can be reduced.

It is to be noted that the present invention is not limited to the examples presented in the embodiments explained above, and it allows for various modes of application and a number of variations.

While an example in which the present invention is employed in a CMOS LSI with the VDD set at approximately 3V or higher is explained in reference to the first and second embodiments, an example in which the present invention is employed in a CMOS LSI with the VDD set at approximately 5V or higher is explained in reference to the third and fourth embodiments and an example in which the present invention is employed in a CMOS LSI with the VDD set at 2V or higher is explained in reference to the fifth, sixth, seventh and eighth embodiments, the present invention is not restricted to these VDD voltages. Furthermore, the present invention may be constituted of a circuit other than a CMOS LSI. For instance, the individual transistors in the embodiments explained earlier may each be constituted of a FET other than a MOSFET, or they may be transistors rather than FETs.

As has been explained in detail, in the first, second, third and fourth aspects of the present invention, in which a second resistor is inserted at the level shift stage to achieve control of the level shift voltage using the product of the current flowing through the resistor and the resistance value, it is possible to drive a large load by reducing the level shift voltage or to reduce the through current flowing through the output stage by increasing the level shift voltage. In addition, the occurrence of crossover distortion can be prevented while keeping down the through current flowing through the output stage.

The entire disclosure of Japanese Patent Application No. 10-255084 filed on Sep. 9, 1998 including specification, clams, drawings and summary is incorporated herein by reference in its entirety.

What is claimed is:

1. An operational amplifier comprising:
   a bias circuit that has a first resistor connected in series between a first source potential and a second source potential, and that generates and outputs a bias voltage through a reduction of a voltage at said first resistor;
   a differential stage that amplifies a difference between a first input voltage and a second input voltage and that outputs an output voltage;
   a level shift stage that has a first MOS transistor which is connected in series to a second resistor and which supplies a constant current controlled by said bias voltage, said level shift stage shifts a level of said output voltage by using a level shift voltage defined by a product of a current flowing through said second resistor and a resistance value of said second resistor and that outputs a level shift output voltage; and
   a push/pull-type output stage that has a second MOS transistor which is connected between said first source potential and an output node, and which is controlled by said output voltage, and that has a third MOS transistor which is connected between said output node and said second source potential and which is controlled by said level shift output voltage.

2. The operational amplifier according to claim 1, wherein said level shift stage comprises:
   a fourth MOS transistor that is connected between said first source potential and a first node, and that is controlled by said output voltage,
   said second resistor is connected between said first node and a second node from which said level shift output voltage is output, and
   said first MOS transistor is connected between said second node and said second source potential, and is controlled by said bias voltage.

3. The operational amplifier according to claim 2, wherein said fourth MOS transistor has a bulk and a source connected with each other.

4. The operational amplifier according to claim 1, wherein said level shift stage comprises:
   a fourth MOS transistor that is connected between said first source potential and a first node, and that is controlled by said output voltage; and
   n fifth MOS transistors connected between said first node and said second resistor,
   said second resistor is connected between the nth fifth MOS transistor and a second node from which said level shift output voltage is output, and
   said first MOS transistor is connected between said second node and said second source potential and is controlled by said bias voltage.

5. The operational amplifier according to claim 4, wherein each of said fourth MOS transistor and said n fifth MOS transistors fare each respectively have a bulk and a source that are respectively connected with each other.

6. The operational amplifier according to claim 1, wherein said level shift stage comprises:
   said second resistor connected between a first node in which said output voltage is input and a second node from which said level shift output voltage is output; and
   said first MOS transistor that is connected between said second node and said second source potential, and that is controlled by said bias voltage.

7. The operational amplifier according to claim 1, further comprising:
   a current correction stage provided between said bias circuit and said differential stage that equalizes a first input current and a second input current at said differential stage.

8. The operational amplifier according to claim 1, wherein said bias circuit comprises:
   a fourth MOS transistor that has a source connected to said first source potential, and a drain and a gate commonly connected;
   a fifth MOS transistor that has a drain and a gate each connected to said drain of said fourth MOS transistor, and a source connected to one end of said first resistor; and
   a sixth MOS transistor that has a drain and a gate each connected to another end of said first resistor, and a source connected to said second source potential, and that outputs said bias voltage from said drain.

9. The operational amplifier according to claim 8, wherein a bulk of said fifth MOS transistor is connected to said source thereof.

10. The operational amplifier according to claim 8, further comprising:
    n seventh MOS transistors that each respectively have a gate and a drain that are respectively connected to each other, said seventh MOS transistors are directly connected between said fifth MOS transistor and said first resistor.

11. The operational amplifier according to claim 10, wherein bulks of said fifth MOS transistor and said n seventh MOS transistors are connected to respective sources thereof.

12. The operational amplifier according to claim 1, wherein said bias circuit comprises:
    a fourth MOS transistor that has a source connected to said first source potential, and a drain and a gate commonly connected to one end of said first resistor; and
    a fifth MOS transistor that has a drain and a gate each connected to another end of said first resistor, and a source connected to said second source potential, and that outputs said bias voltage from said drain thereof.

13. The operational amplifier according to claim 12, wherein said level shift stage further comprises a sixth MOS transistor that is connected between a first end of said second resistor and said first source potential, and that is controlled by a voltage of said drain of said fourth MOS transistor.

14. The operational amplifier according to claim 2, wherein said first source potential is 3V or higher.

15. The operational amplifier according to claim 4, wherein said first source potential is 2V or higher.

16. The operational amplifier according to claim 6, wherein said first source potential is 5V or higher.

17. The operational amplifier according to claim 8, wherein said first source potential is 3V or higher.

18. The operational amplifier according to claim 10, wherein said first source potential is 2V or higher.

19. The operational amplifier according to claim 12, wherein said first source potential is 5V or higher.

* * * * *